US012794428B2

(12) United States Patent
Yan et al.

(10) Patent No.: US 12,794,428 B2
(45) Date of Patent: Nov. 10, 2026

(54) SYSTEMS AND METHODS FOR DIFFERENTIAL LINE DRIVERS

(71) Applicant: Avago Technologies International Sales Pte. Limited, Singapore (SG)

(72) Inventors: Han Yan, Woerden (NL); Jan Mulder, Houten (NL); Sijia Wang, Utrecht (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 39 days.

(21) Appl. No.: 18/786,048

(22) Filed: Jul. 26, 2024

(65) Prior Publication Data

US 2026/0088785 A1 Mar. 26, 2026

(51) Int. Cl.
*H03F 3/45* (2006.01)
*H03M 1/66* (2006.01)

(52) U.S. Cl.
CPC .......... *H03F 3/45475* (2013.01); *H03M 1/66* (2013.01)

(58) Field of Classification Search
CPC ............. H03F 3/45475; H03F 3/45076; H03F 3/45632; H03F 3/45636; H03F 3/45645; H03F 3/45932; H03F 3/45941; H03M 1/66; H03K 5/2481; G11C 7/062; G11C 7/08
See application file for complete search history.

(56) References Cited

U.S. PATENT DOCUMENTS 5,856,758 A 1/1999 Joffe et al.
6,522,179 B2 * 2/2003 Ferianz ............... H03F 3/45475 327/108
6,724,219 B1 4/2004 Kim et al.
7,701,284 B2 4/2010 Liao et al.
9,231,538 B1 1/2016 Birkeland et al.
2002/0070770 A1 6/2002 Ferianz
2007/0273444 A1 11/2007 Bajdechi et al.
2007/0296456 A1 * 12/2007 van der Goes .... H03K 19/0005 326/30
2009/0237122 A1 9/2009 Wenske et al.
2011/0062781 A1 3/2011 Liao
2013/0214864 A1 8/2013 Tsou
(Continued)

OTHER PUBLICATIONS

N. Ramachandran, "Design of a 3.3 V Analog Video Line Driver with Controlled Output Impedance," (May 2003), 83 pages.
(Continued)

*Primary Examiner* — Jung Kim
(74) *Attorney, Agent, or Firm* — Quarles & Brady LLP

(57) ABSTRACT

The present application is directed to electrical circuits. A circuit includes a digital-to-analog converter configured to provide analog signals at a first output by converting digital signals. The analog signals include a pair of differential signals. The pair of differential signals is characterized by a first voltage swing at the first output. The circuit also includes a pair of differential lines coupled to the first output for transmitting the pair of differential signals. The circuit additionally includes a differential line driver coupled to the pair of differential lines. The differential line driver is configured to amplify the differential signals to a second voltage swing at a second output. The circuit additionally includes a third output coupled to the pair of differential lines. The circuit also includes a first sub-circuit coupled from the second output to the first output and configured to provide negative feedback.

9 Claims, 3 Drawing Sheets

(56) References Cited

U.S. PATENT DOCUMENTS

| | | | |
|---|---|---|---|
| 2014/0320229 | A1 | 10/2014 | Ali |
| 2016/0173033 | A1 | 6/2016 | Chang |

OTHER PUBLICATIONS

R. Stephens, "Active Output Impedance for ADSL Line Drivers," (Nov. 2002), 52 pages.

Extended European Search Report for Patent Application No. EP25191361.2 dated Dec. 2, 2025; 15 pages.

Bicakci, Ara et al. "A CMOS Line Driver for ADSL Central Office Applications", IEEE Journal of Solid-State Circuits, vol. 38, No. 12, Dec. 2003, pp. 2201-2208, XP001221470, ISSN: 0018-9200, DOI: 10.1109/JSSC.2003.818570.

* cited by examiner

SYSTEMS AND METHODS FOR DIFFERENTIAL LINE DRIVERS

FIELD OF INVENTION

The subject technology is directed to electrical circuits.

BACKGROUND OF THE INVENTION

In wired communication systems, transmitters often need to maintain backward compatibility with legacy standards that require relatively high transmit voltages. This requirement poses significant challenges in the context of modern integrated circuit (IC) technologies. As supply voltages decrease and device reliability requirements become more stringent, designing integrated drivers capable of providing these high voltages reliably and efficiently becomes increasingly difficult.

Various existing approaches, such as power and area-efficient class AB voltage mode drivers, struggle to meet these demands. These drivers often fail to achieve the necessary high output voltages, and they sometimes rely on additional active circuits to boost the output voltage. While effective, these supplementary circuits incur extra power consumption, which is undesirable in power-sensitive applications. To address these challenges, improved techniques for an energy and area-efficient line driver with an enlarged transmit voltage swing are desired.

BRIEF DESCRIPTION OF THE DRAWINGS

A further understanding of the nature and advantages of particular embodiments may be realized by reference to the remaining portions of the specification and the drawings, in which reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
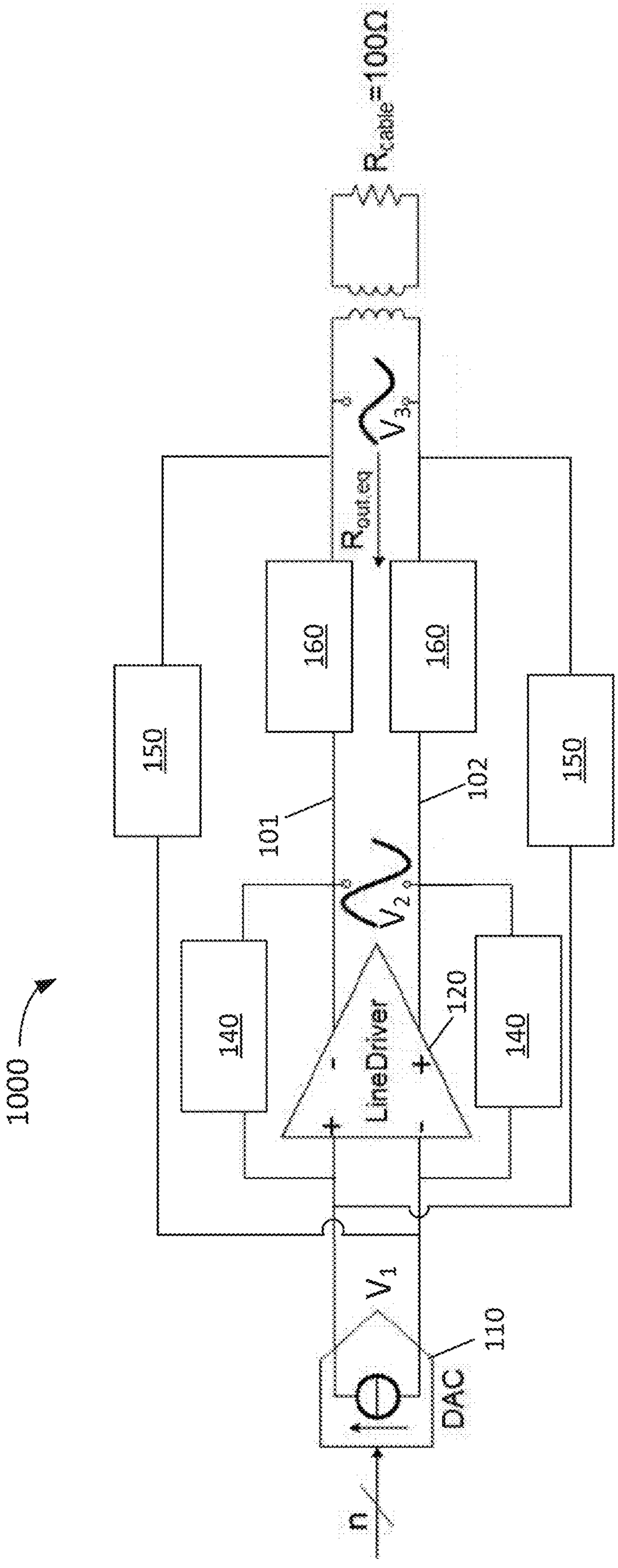
FIG. 1 is a line driver for increasing voltage swing at an MDI output with two feedback circuits according to the embodiments of the subject technology.

The present application is directed to electrical circuits. In a specific embodiment, the present invention provides a circuit, which includes a digital-to-analog converter configured to provide analog signals at a first output by converting digital signals. The analog signals include a pair of differential signals. The pair of differential signals is characterized by a first voltage swing at the first output. The circuit also includes a pair of differential lines coupled to the first output for transmitting the pair of differential signals. The circuit additionally includes a differential line driver coupled to the pair of differential lines. The differential line driver is configured to amplify the differential signals to a second voltage swing at a second output. The circuit additionally includes a third output coupled to the pair of differential lines. The circuit also includes a first sub-circuit coupled from the second output to the first output and configured to provide negative feedback. There are other embodiments as well.

The subject technology addresses these challenges of making line drivers capable of providing these high voltages reliably and efficiently. This technique works in conjunction with an efficient voltage mode driver to meet the high amplitude requirements without compromising performance and reliability. By leveraging this novel approach, the subject technology ensures that transmitters can achieve the necessary high output voltages while maintaining compatibility with legacy standards, all within the constraints of modern IC technology. This solution provides an advancement in the design of integrated drivers for wired communication systems, offering a practical and efficient method to overcome the limitations imposed by decreasing supply voltages and stringent reliability requirements.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent, or similar purpose unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Moreover, the terms left, right, front, back, top, bottom, forward, reverse, clockwise, and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term “about.” In this application, the use of the singular includes the plural unless specifically stated otherwise, and the use of the terms “and” and “or” means “and/or” unless otherwise indicated. Moreover, the use of the terms “including” and “having,” as well as other forms, such as “includes,” “included,” “has,” “have,” and “had,” should be considered non-exclusive. Also, terms such as “element” or “component” encompass both elements and components comprising one unit and elements and components that comprise more than one unit, unless specifically stated otherwise.

As used herein, the phrase “at least one of” preceding a series of items, with the term “and” or “or” to separate any of the items, modifies the list as a whole, rather than each member of the list (i.e., each item). The phrase “at least one of” does not require the selection of at least one of each item listed; rather, the phrase allows a meaning that includes at least one of any one of the items, and/or at least one of any combination of the items. By way of example, the phrases “at least one of A, B, and C” or “at least one of A, B, or C” each refer to only A, only B, or only C; and/or any combination of A, B, and C. In instances where it is intended that a selection be of “at least one of each of A, B, and C,” or alternatively, “at least one of A, at least one of B, and at least one of C,” it is expressly described as such.

FIG. 1 shows a line driver for increasing voltage swing at an MDI output with two feedback circuits according to the embodiments of the subject technology. As an example, FIG. 1 shows a voltage-mode class AB line driver used to increase power and area efficiency. For example, a line driver may refer to an electronic amplifier or circuit designed to enhance the transmission of signals over long distances by boosting the signal strength and ensuring it remains clear and intact. Line drivers are commonly used in communication systems, data transmission lines, and audio equipment to drive signals through cables with minimal loss and distortion. They can handle various signal types, including analog, digital, and differential signals, and are often characterized by their ability to provide high current and voltage outputs. As an example, a differential signal refers to a type of electrical signal that is transmitted using two complementary voltage levels. Unlike single-ended signals that reference a common ground, differential signals rely on the difference in voltage between two signal lines to convey information. This method is beneficial for reducing noise and improving signal integrity in high-speed and high-frequency communication systems. The design of a line driver may include features such as impedance matching, noise reduction, and protection against signal degradation, making them useful for maintaining signal integrity in a wide range of applications. The class AB line drivers combine the advantages of both class A and class B amplifiers, providing a balance between linearity and efficiency, which makes them highly suitable for applications requiring high signal fidelity and power efficiency. For example, impedance matching refers to the process or mechanism of making the impedance of a load (such as a transmission line or circuit) equal to the impedance of the source or the system driving it, which helps maximize power transfer and minimize signal reflection, which can cause signal loss, distortion, and other performance issues. In high-speed and high-frequency communication systems, achieving impedance matching is critical to ensure efficient and reliable signal transmission over long distances and through various mediums. Embodiments of the present application provide impedance matching for the efficient functioning of the line driver and the transmission of differential signals over the differential lines.

In an embodiment, circuit 1000 shown in FIG. 1 includes a digital-to-analog converter (DAC) 110 configured to convert digital signals in the format of a serial data stream to analog signals with a first voltage swing $V_1$ at a DAC output. A pair of differential lines (101 and 102) coupled to the DAC output for carrying the analog signals in the form of differential signals. For example, differential lines may be a pair of conductors or transmission paths used to carry differential signals. These lines are designed to transmit the two complementary voltage levels that make up a differential signal. The physical and electrical properties of the differential lines are often optimized to ensure minimal signal degradation and to maintain impedance matching, which is crucial for high-speed data transmission. Then, a differential line driver 120 is coupled to the pair of differential lines (101 and 102) to amplify the differential signal with a second voltage swing $V_2$ at a line-driver output over the first voltage swing $V_1$ at the DAC output.

The core of the line driver 120 comprises a pair of transistors (not explicitly shown), typically arranged in a push-pull configuration. This configuration allows the line driver to produce a high output voltage swing by leveraging the complementary action of the transistors. When one transistor conducts, the other is off, and vice versa, ensuring that the line-driver output can swing both positively and negatively relative to the ground, thus driving a differential signal with the second voltage swing $V_2$ to the downstream of the pair of differential lines 101 and 102. The operation of the class AB line driver 120 is characterized by its ability to operate in both the active (linear) region and the cutoff region, depending on the signal amplitude. During small signal conditions, both transistors conduct slightly, operating in the linear region and providing high linearity with minimal distortion. As the signal amplitude increases, one transistor fully turns on while the other turns off, similar to a class B amplifier. This push-pull action minimizes the crossover distortion typically found in pure class B amplifiers while maintaining higher efficiency than a class A amplifier.

The line driver 120 also is coupled with a first sub-circuit 140 coupled from the line-driver output to the DAC output in parallel to the respective one of the pair of differential lines 101 and 102. The first sub-circuit 140 is a first feedback sub-circuit configured to provide negative feedback for maintaining the second voltage swing $V_2$ at the line-driver output, which will be transmitted further downstream of the differential lines 101 and 102 to a media-dependent interface (MDI) output. For example, MDI refers to a component in network communications, particularly in Ethernet-based systems. For example, MDI serves as the physical interface between the network device (such as a computer, switch, router, or transmitter) and the transmission medium (such as twisted-pair cables, fiber optics, or coaxial cables). The term "sub-circuit", for example, refers to a subset of an electrical circuit that performs a specific function within a larger system. A sub-circuit may include one or more electronic components such as resistors, capacitors, transistors, and other elements arranged to achieve a particular operation. The feedback mechanism in circuit 1000 ensures the stability and accuracy of the line-driver output signal. By feeding a portion of the output signal of the line driver 120 back to its input (i.e., DAC output), the circuit can correct for any non-linearities or deviations, resulting in a clean and accurate reproduction of the input signal at the output. This feedback also helps in maintaining the desired output impedance of the line driver 120 for matching with the signal line (e.g., each differential line 101 or 102) to minimize reflections and signal loss.

Circuit 1000 also includes a second sub-circuit 150 coupled from the MDI output to the DAC output crossing from one of the pair of differential lines to another. The second sub-circuit 150 is a second feedback sub-circuit configured to provide positive feedback for enlarging a third voltage swing $V_3$ of the differential signals at the MDI output, which is coupled to an end of the pair of differential lines 101 and 102 designed for interfacing a transmission medium. For example, the term "sub-circuit" may refer to a functional block within a larger circuit that performs a specific task. Positive feedback provided by the second sub-circuit 150 increases the effective gain of circuit 1000. By feeding a portion of the output signal back into the input of the line driver 120 in phase, the signal at the output is reinforced. This results in a higher amplitude output signal, useful for applications requiring strong signal transmission over long distances or for meeting specific requirements of legacy standards. Additionally, positive feedback provided in circuit 1000 helps to extend the linear operating range of the line driver. This means that the transistors of line driver 120 can handle larger signal swings without distortion, improving the fidelity of the transmitted signal. In essence, the feedback helps to maintain the linearity of the amplifier over a wider range of input conditions.

Circuit 1000 further includes a third sub-circuit 160 coupled in series in respective one of the pair of differential lines (101 and 102) between the line-driver output and the MDI output. In an embodiment, the third sub-circuit 160, combined with the second sub-circuit 150, is configured to form an impedance termination network associated with the MDI output at the end of the pair of differential lines (101 and 102), from which the differential signals will be coupled to a transmission medium, for example, a cable, for transmitting further through a wired communication system. As shown, the MDI output is characterized by an effective output impedance $R_{out,eq}$ which is required to be matched closely with an impedance of the cable, $R_{cable}$. For example, $R_{cable}=100\Omega$ typically. The third sub-circuit 160, in an embodiment, is provided as a tunable termination circuit for assisting the impedance matching at the MDI output when the second sub-circuit 150 is also coupled to the MDI output. The combination of the termination network provided in the third sub-circuit 160 and positive feedback provided through the second sub-circuit 150 ensures that the line driver 120 can deliver high output voltage swing $V_3$ while maintaining impedance matching and signal integrity at the MDI output with the load. The feedback loop associated with sub-circuit 150 stabilizes the gain and enhances the linearity, allowing the driver to handle high-amplitude signals without significant distortion.

Figure 2:
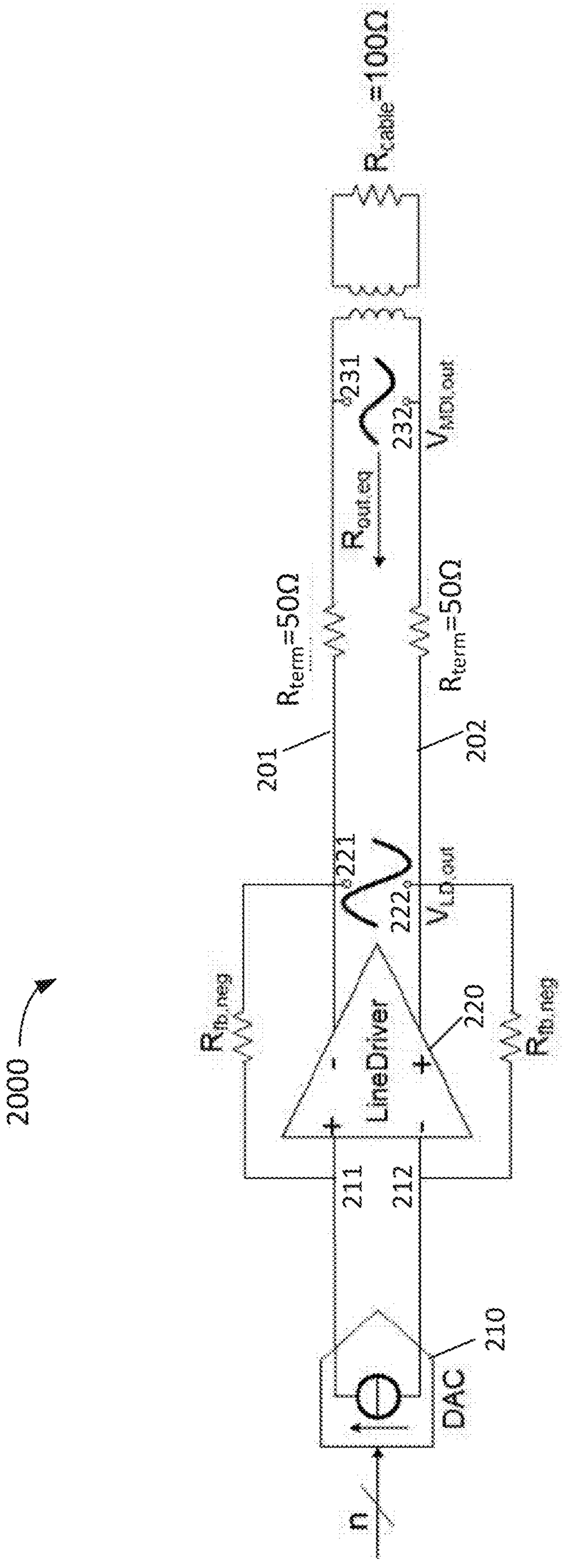
FIG. 2 is a line driver for increasing voltage swing at an MDI output with the positive feedback disabled according to an embodiment of the subject technology.

FIG. 2 shows a line driver for increasing voltage swing at an MDI output with the positive feedback disabled according to an embodiment of the subject technology. In circuit 2000, DAC 210 receives digital data stream signals n from the transmission line and converts the digital signals to analog signals which are carried as the differential input signals at a DAC output. A differential line driver 220 is coupled to a pair of differential lines (201 and 202) to receive the differential input signal at the DAC output. Line driver 220 amplifies the differential signals to a voltage swing $V_{LD,out}$ at the line-driver output. Line driver 220 is coupled in parallel to a feedback resistor $R_{fb,neg}$ between a first node 211 in a first differential line 201 at the DAC output and a first node 221 of a line-driver output associated with the first differential line 201. For example, a node in an electrical circuit refers to a point where two or more circuit elements such as resistors, capacitors, or wires are electrically connected. For example, a node may serve as a junction point that facilitates the flow of electrical current between different components of the circuit. A redundant feedback resistor $R_{fb,neg}$, having the same resistance, is also coupled in parallel to the line driver 220 between a second node 212 in a second differential line 202 at the DAC output and a second node 222 of a line driver output associated with the second differential line 202. The feedback resistors $R_{fb,neg}$ are to ensure stability and linearity of the voltage swing $V_{LD,out}$ at the line-driver output by providing a controlled amount of the signals at the line-driver output back to the line-driver input, i.e., the DAC output, helping correct any deviations from the desired output.

Referring to FIG. 2, circuit 2000, like circuit 1000, also requires that the output impedance at the MDI output needs to match cable impedance in all frequency modes. In circuit 2000, a positive feedback feature, like the second sub-circuit 150 in circuit 1000, is disabled or simply not included for network communication systems, particularly within Ethernet networks and energy-efficient communication protocols. Circuit 2000 includes a termination resistor $R_{term}$ coupled in a first differential line 201 between a first node 221 at the line-driver output and a first node 231 of the MDI output, and a redundant termination resistor $R_{term}$, having the same resistance, coupled in a second differential line 202 between a second node 222 at the line-driver output and a second node 232 of the MDI output. The two redundant termination resistors $R_{term}$ serve as an impedance termination network to ensure that an effective output impedance $R_{out,eq}$ at the MDI output can be matched with a cable impedance $R_{cable}$ coupled to the end of the pair of differential lines.

For example, a typical transmission cable impedance $R_{cable}$ for twisted-pair cables, like Cat 5, Cat 5e, Cat 6, and Cat 6a, used in Ethernet networking is 100Ω. Each termination resistor $R_{term}$ is set to 50Ω and the effective output impedance $R_{out,eq}$ of circuit 2000 at the MDI output is 100Ω which matches the cable impedance $R_{cable}$. This setting associated with the termination resistor $R_{term}$ in each differential line yields impedance division seen by the line driver 220, such that the voltage swing $V_{MDI,out}$ at the MDI output is equal to half of the voltage swing $V_{ID,out}$ at the line-driver output. For example, If $V_{ID,out}$ is $4V_{ppd}$, then $V_{MDI,out}$ is $2V_{ppd}$. Thus, the transmitted signal amplitude is limited and may not be high enough for legacy standards. In an alternative thinking, if the $V_{MDI,out}$ is forced to be made higher to meet the requirement of the systems using relatively high transmit voltages, it has to operate the line driver to generate higher voltage swing $V_{LD,out}$ at the line-driver output, which costs extra power and causes more reliability issues.

In many efforts to obtain a higher transmit voltage swing at the MDI output while keeping the line-driver output relatively low, one approach includes adding an extra current steering DAC directly at the MDI to provide an extra voltage swing. However, the number of bits required for the extra DAC is dependent on the linearity requirement of the high signal amplitude applications. The extra DAC design can be complex and not efficient enough when certain linearity performance and energy efficiency are required. Another approach may include using an auxiliary (transconductance) driver to sense the output voltage of the main line driver and supply an extra boost current directly to the MDI output. By using the signal information from the line-driver output, this design may be simple but drives higher power consumption or causes signal distortion. The addition of an auxiliary driver can also affect the impedance matching between the MDI output and the transmission medium.

Figure 3:
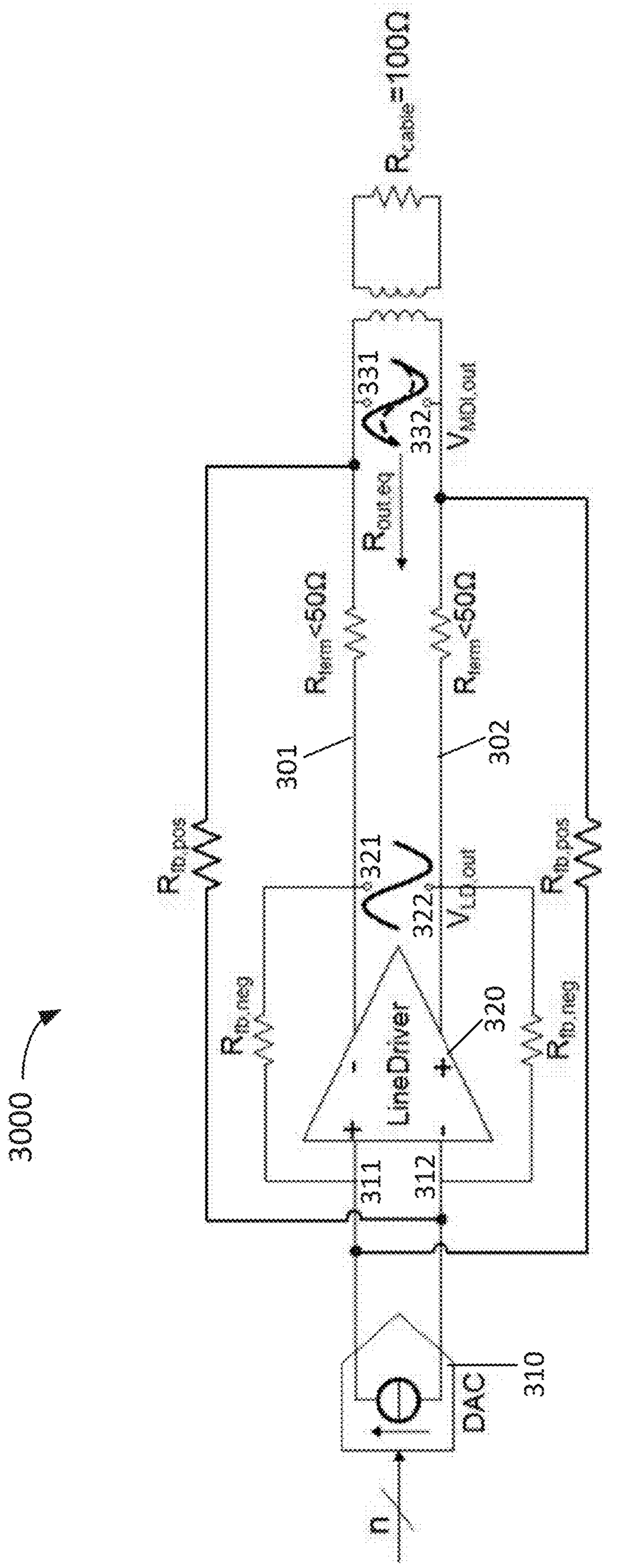
FIG. 3 is a line driver for increasing voltage swing at an MDI output with the positive feedback enabled according to an embodiment of the subject technology.

FIG. 3 shows a line driver for increasing voltage swing at the MDI output with the positive feedback enabled according to an embodiment of the subject technology. In an embodiment, a line driver with high-output-swing mode is provided with positive feedback being enabled between the MDI output and the driver input. Circuit 3000 shows an example of the transmitter circuit containing the line driver in a differential setting to increase the output voltage swing $V_{MDI,out}$ at the MDI output while keeping the voltage swing $V_{LD,out}$ at the line-driver output relatively low. The voltage swing $V_{LD,out}$ at the line-driver output is the swing amplitude of the differential signal measured between node 321 and node 322. The voltage swing $V_{MDI,out}$ at the MDI output is the swing amplitude of the differential signals measured between node 331 and node 332.

Referring to FIG. 3, a differential line driver 320 is coupled to a pair of differential lines, a first differential line 301 and a second differential line 302, to receive an input differential signal at a DAC output. DAC 310 receives digital data stream signals n and converts the digital signals to analog signals which are carried as the differential signals. Line driver 320 amplifies the differential signals to a voltage swing $V_{LD,out}$ at the line-driver output. Line driver 320 is coupled in parallel to a negative feedback resistor $R_{fb,neg}$ between a node 311 at the DAC output associated with the first differential line and a node 321 of the line-driver output. A redundant negative feedback resistor $R_{fb,neg}$, having the same resistance, is also coupled in parallel to the line driver 320 between node 322 and node 312 at the DAC output associated with the second differential line. The negative feedback resistors $R_{fb,neg}$ are to ensure stability and linearity of the voltage swing $V_{LD,out}$ at the line-driver output by providing a controlled amount of the signals at the line-driver output back to the line-driver input, i.e., the DAC output, helping correct any deviations from the desired output.

Additionally, circuit 3000 also includes a positive feedback feature, like the second sub-circuit 150 in circuit 1000, to improve the overall performance of line driver 320, ensuring higher signal amplitudes and better signal integrity at the MDI output and over the transmission line. In circuit 3000, the positive feedback sub-circuit is enabled by coupling a pair of positive feedback resistors $R_{fb,pos}$ respectively in parallel from respective one MDI output node (331 or 332) to a node (311 or 312) at the DAC output but crossing to alternative one of the pair of differential lines (302 or 301). Each of the pair of positive feedback resistors $R_{fb,pos}$ has the same resistance. One positive feedback resistor $R_{fb,pos}$ cross-couples from node 331 of the MDI output associated with the first differential line to node 312 of the DAC output associated with the second differential line. Another positive feedback resistor $R_{fb,pos}$ cross-couples from node 332 of the MDI output associated with the second differential line to node 311 of the DAC output associated with the first differential line. In an embodiment, the positive feedback resistor $R_{fb,pos}$ is configured to have its resistance tunable to a nominal value greater than the resistance of the negative resistor $R_{fb,neg}$. As the resistance of $R_{fb,pos}$ is set to the nominal value, the positive feedback is enabled, being applicable for the line drivers in certain operation modes to provide extra output signal swing. In an embodiment, the positive feedback resistor $R_{fb,pos}$ is configured to be removed from the differential lines and the MDI output to disable or turn off the positive feedback mechanism (e.g., like circuit 2000) for other operation modes to keep output signal swing low.

Referring to FIG. 3, circuit 3000 still needs to maintain impedance matching at the MDI output that is coupled to a transmission medium (such as a cable). In an embodiment, circuit 3000 includes a termination resistor $R_{term}$ coupled in the first differential line between node 321 at the line-driver output and node 331 of the MDI output, and a redundant termination resistor $R_{term}$, having the same resistance, coupled in the second differential line between node 322 at the line-driver output and node 332 of the MDI output. The two redundant termination resistors $R_{term}$ serve as an impedance termination network at the MDI output of circuit 3000. This impedance termination network combined with the positive feedback sub-circuit associated with resistors $R_{fb,pos}$ is to ensure that an effective output impedance $R_{out,eq}$ at the MDI output can be matched with a cable impedance $R_{cable}$ coupled to the end of the pair of differential lines (301 and 302). In an embodiment, the MDI output is configured to keep its equivalent output impedance $R_{out,eq}$ at low frequency to be approximately 100Ω for matching the load impedance of a transmission medium such as a cable. Under this setup, considering the voltage division in the presence of series and parallel resistances, the voltage division factor is given by the ratio of the impedance of the line driver to the total series resistance (line driver impedance plus twice the termination resistance). This leads to a larger signal swing at the MDI output:

$$V_{MDI,out} = V_{LD,out} \times \left(100\ \Omega/(2 \times R_{term} + 100\ \Omega)\right)$$

In this setup with positive feedback being enabled, the two termination resistors $R_{term}$ of circuit 3000 are configured to be tuned to be smaller than 50Ω while still keeping the MDI impedance matching. Based on the equation above and $R_{term}$ being tuned to be smaller than 50Ω the voltage swing $V_{MDI,out}$ at the MDI output will be smaller than $V_{LD,out}$ but will be larger than ½ $V_{ID,out}$. This makes a larger $V_{MDI,out}$ swing at the MDI output possible while keeping line driver output swing reasonable, enhancing linearity and high-voltage performance.

Circuit 2000, in an embodiment, is substantially circuit 3000 with the positive feedback resistors being disabled. In that case, each of the two termination resistors $R_{term}$ is tuned to be equal to (approximately) 50Ω to keep the output impedance at the MDI output matching the cable impedance. In some embodiments, the termination resistor $R_{term}$ is configured within a tunable resistor circuit which comprises one or more current sources used for introducing current-controlled IR drop to adjust a transistor gate voltage to track the signal voltage swing in the signal line. By changing the gate voltage, the resistance of the termination resistor is changed accordingly to ensure the impedance match across the interface.

According to an embodiment, the present invention provides a circuit, which includes a digital-to-analog converter configured to provide analog signals at a first output by converting digital signals. The analog signals include a pair of differential signals. The pair of differential signals is characterized by a first voltage swing at the first output. The circuit also includes a pair of differential lines coupled to the first output for transmitting the pair of differential signals. The circuit additionally includes a differential line driver coupled to the pair of differential lines. The differential line driver is configured to amplify the differential signals to a second voltage swing at a second output. The circuit additionally includes a third output coupled to the pair of differential lines. The circuit also includes a first sub-circuit coupled from the second output to the first output and configured to provide negative feedback for maintaining the second voltage swing. The circuit includes a second sub-circuit coupled from the third output to the first output and configured to provide positive feedback for enlarging a third voltage swing at the third output. The circuit further includes a third sub-circuit coupled in respective one of the pair of differential lines between the second output and the third output.

According to another embodiment, the present invention provides a circuit that includes a digital-to-analog converter configured to provide analog signals at a first output by converting digital signals. The analog signals include a pair of differential signals. The pair of differential signals is characterized by a first voltage swing at the first output. The circuit also includes a pair of differential lines coupled to the first output for transmitting the pair of differential signals. The pair of differential lines comprises a first differential line and a second differential line. The circuit additionally includes a third output coupled to the pair of differential lines. The circuit also includes a differential line driver coupled to the pair of differential lines. The differential line driver is configured to amplify the differential signals to a second voltage swing at a pair of second outputs. The circuit also includes a pair of first resistors comprising a first resistor and a second resistor. The first resistor is configured in parallel relative to the first differential line. The second resistor is configured in parallel relative to the second differential line. The circuit additionally includes a pair of second resistors comprising a third resistor and a fourth resistor. The third resistor is coupled to the first resistor, and the fourth resistor is coupled to the second resistor. The circuit additionally includes a pair of third resistors comprising a fifth resistor and a sixth resistor. The fifth resistor is coupled to the second resistor and the third resistor. The sixth resistor is coupled to the first resistor and the fourth resistor. The circuit also includes a transmitter output coupled to the pair of second resistors to provide a third voltage swing. There are other embodiments as well.

While the above is a full description of the specific embodiments, various modifications, alternative constructions, and equivalents may be used. Therefore, the above description and illustrations should not be taken as limiting the scope of the present invention which is defined by the appended claims.

What is claimed is:

1. A circuit comprising:

a digital-to-analog converter configured to provide analog signals at a first output by converting digital signals, the analog signals comprising a pair of differential signals, the pair of differential signals being characterized by a first voltage swing at the first output;

a pair of differential lines coupled to the first output for transmitting the pair of differential signals;

a differential line driver coupled to the pair of differential lines, the differential line driver being configured to amplify the differential signals to a second voltage swing at a second output;

a third output coupled to the pair of differential lines;

a first sub-circuit coupled from the second output to the first output and configured to provide negative feedback for maintaining the second voltage swing; and a second sub-circuit coupled from the third output to the first output and configured to provide positive feedback for enlarging a third voltage swing at the third output;

a third sub-circuit coupled in respective one of the pair of differential lines between the second output and the third output;

wherein the first sub-circuit comprises a pair of first resistors characterized by a first resistance, and the second sub-circuit comprises a pair of second resistors is characterized by a second resistance, wherein the second sub-circuit is enabled by tuning the second resistance to a finite value greater than the first resistance and disabled by disconnecting the pair of second resistors.

2. The circuit of claim 1, wherein the pair of first resistors comprises a first resistor and a second resistor, the first resistor coupling a first node of the second output to a second node of the first output associated with a first one of the pair of differential lines, the second resistor coupling a third node of the second output to a fourth node of the first output associated with a second one of the pair of differential lines.

3. The circuit of claim 1, wherein the first sub-circuit is configured to provide impedance matching across the differential line driver.

4. The circuit of claim 1, wherein the pair of second resistors comprises a third resistor and a fourth resistor, the third resistor coupling a first one of the pair of differential lines at the third output to a second one of the pair of differential lines at the first output, the fourth resistor coupling the second one of the pair of differential lines at the third output to the first one of the pair of differential lines at the first output.

5. The circuit of claim 1, wherein the third output comprises an output impedance matched with a cable resistance of approximately 100Ω at a first frequency range.

6. The circuit of claim 5, wherein the third sub-circuit comprises a pair of third resistors, the third resistors comprises a fifth resistor and a sixth resistor, the fifth resistor coupling a fifth node of the second output to a sixth node of the third output in the first differential line, the sixth resistor coupling a seventh node of the second output to a eighth node of the third output in the second differential line.

7. The circuit of claim 6, wherein the pair of third resistors is characterized by a tunable resistance, the tunable resistance being no greater than 50Ω.

8. The circuit of claim 7, wherein the third output comprises the third voltage swing at half of the second voltage swing at the second output when the second sub-circuit is disabled and each of the third resistors is tuned at 50Ω.

9. The circuit of claim 7, wherein the third output comprises the third voltage swing greater than half of the second voltage swing at the second output when the second sub-circuit is enabled, and each of the third resistors is tuned to be lower than 50Ω.

* * * * *